United States Patent
Wang et al.

[19]

[11] Patent Number: 6,121,108
[45] Date of Patent: Sep. 19, 2000

[54] METHOD FOR FABRICATING A CAPACITOR IN A DYNAMIC RANDOM ACCESS MEMORY

[75] Inventors: Chuan-Fu Wang, Taipei Hsien; King-Lung Wu, Tainan Hsien, both of Taiwan

[73] Assignee: United Microelectroincs Corp., Hsinchu, Taiwan

[21] Appl. No.: 09/181,467

[22] Filed: Oct. 28, 1998

[51] Int. Cl.[7] .................................................... H01L 21/20
[52] U.S. Cl. ........................ 438/396; 438/254; 438/397
[58] Field of Search .................................. 438/239, 240, 438/241, 253, 254, 255, 256, 396, 397, 398, 399

[56] References Cited

U.S. PATENT DOCUMENTS

| | | | |
|---|---|---|---|
| 5,137,842 | 8/1992 | Chan et al. | 438/254 |
| 5,335,138 | 8/1994 | Sandhu et al. | 361/303 |
| 5,399,518 | 3/1995 | Sim et al. | 438/396 |
| 5,438,013 | 8/1995 | Kim et al. | 438/396 |
| 5,443,993 | 8/1995 | Park et al. | 438/400 |
| 5,491,103 | 2/1996 | Ahn et al. | 438/396 |

*Primary Examiner*—Carl Whitehead, Jr.
*Assistant Examiner*—Jeff Vockrodt
*Attorney, Agent, or Firm*—Thomas, Kayden, Horstemeyer & Risley

[57] ABSTRACT

A method for forming a cylinder capacitor on a dynamic random access memory (DRAM) device is provided. The method includes sequentially forming a dielectric layer, an etching stop layer, and an insulating layer over a substrate, having a field effect transistor (FET). An opening is formed to expose a source region of the FET by patterning the dielectric layer, the etching stop layer, and the insulating layer. A conductive layer is formed on the insulating layer with the opening being filled. A concave oxide structure is formed on the conductive layer. A portion of the conductive layer other than the concave structure is removed. The concave structure is etched to form two oxide pillars on the conductive layer. Four conductive spacers are formed on each side of the oxide pillars with an electrical coupling with the conductive layer. The oxide pillar and the insulating layer are removed to expose the conductive spacers and a portion of the conductive layer. The conductive layer and the conductive spacers serve together as an lower electrode. A dielectric film is formed over the exposed surface of the lower electrode. An upper electrode is formed on the dielectric film.

11 Claims, 3 Drawing Sheets

METHOD FOR FABRICATING A CAPACITOR IN A DYNAMIC RANDOM ACCESS MEMORY

BACKGROUND OF THE INVENTION

1. Field of the Invention:

This invention relates to semiconductor fabrication, and more particularly to a method for fabricating a capacitor on a field effect transistor (FET) of a dynamic random access memory (DRAM).

2. Description of Related Art:

Typically, one memory cell of a DRAM device stores one binary data through a capacitor formed in the memory cell. The capacitor can be selectively charged or discharged in order to store the binary data. For example, a charged status of the capacitor represents a binary data of "1", and a discharged status of the capacitor represents a binary data of "0". The capacitance of the capacitor depends on an electrode surface of the capacitor, a distance between two electrodes, and a dielectric material between two electrodes. The memory cell also includes a field effect transistor (FET), to which the capacitor is coupled, so as to perform an operation of charging the capacitor or discharging the capacitor. Usually the capacitor is coupled to a source region of the FET. A word line and a bit line are respectively coupled to a gate and a drain region of the FET so as to select the memory cell.

A smaller memory device dimension is always desired by semiconductor manufacturers. In order to reduce memory device dimension, a structure of DRAM has been developed from a two-dimensional structure to a three-dimensional structure, or called a stacked structure. A stacked capacitor includes multiple plates that are stacked up to produce more charge storage surface. This is strongly necessary. When the DRAM dimension is reduced, capacitance of a two-dimensional capacitor is accordingly reduced. A poor capacitance can causes several problems, such as a poor read-out performance, an increase of soft error, or a consumption of power at a low voltage operation. Thus a poor capacitance causes a memory device not to be fabricated in higher density.

It is an effort for semiconductor manufacturers to reduce the memory device dimension with a maintenance of a necessary capacitance. Particularly, it is a main goal to increase capacitance without increasing a horizontal dimension of the FET in the memory cell. A cylinder capacitor belonging to one of three-dimensional structures is proposed because the cylinder capacitor can be formed with a better stack density. Both an inner surface and an outer surface of the cylinder capacitor can be effectively used to form electrodes so that the cylinder capacitor is very suitable for a DRAM with memory capability of 64 Mb or higher.

SUMMARY OF THE INVENTION

It is therefore an objective of the present invention to provide a method for fabricating a cylinder capacitor so as to increase a capacitance of the DRAM.

In accordance with the foregoing and other objectives of the present invention, a method for fabricating a cylinder capacitor with a sufficiently large capacitance is provided. The method of the invention includes sequentially forming a dielectric layer, an etching stop layer, and a first insulating layer over a substrate, having a field effect transistor (FET). Pattering the dielectric layer, the etching stop layer, and the first insulating layer forms an opening to expose an interchangeable source/drain region of the FET. A conductive layer is formed over the substrate with the opening being filled. A second insulating is formed over the conductive layer. Using photolithography and etching, a top portion of the second insulating layer, other than the region above the opening, is removed. Thus, a convex layer above the opening is formed on top of the second insulating layer. Two first spacers are respectively formed on each sidewall of the convex layer. Using the first spacer as an etching mask, the second insulating layer is etched to expose the conductive layer. The second insulating layer between the first spacers is not completely etched due to an additional thickness from the convex layer. A concave structure including the first spacer and a remaining second insulating layer is therefore formed on the conductive layer above the opening. Using the concave structure as a mask, the exposed portion of the conductive layer is removed so as to expose the first insulating layer. Using the spacer as a mask, the remaining second insulating layer between the first spacers are removed, in which a top portion of the first insulating layer may also be removed. The first spacer is removed, and the remaining second insulating layer under the first spacers forms two pillars on the edge of the conductive layer. Several conductive spacers are respectively formed on each sidewall of the pillars, in which the outer conductive spacers are located on the first insulating layer, and the inner conductive spacers are located on the conductive layer. The conductive spacers and the conductive layer are electrically coupled together to serve as a lower electrode of the cylinder capacitor. Using the etching stop layer as an etching stop point, the remaining first insulating layer and the pillars are removed so that the conductive layer and the conductive spacers are exposed. A dielectric film is formed over the exposed surface of the first conductive layer and the conductive spacers. Another conductive layer serving as an upper electrode of the cylinder capacitor is formed over the substrate to cover the dielectric film.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIGS. 1–7 are cross-sectional views of a memory cell, schematically illustrating a fabrication process of a capacitor in the memory cell, according to a preferred embodiment of the invention.

Figure 1:
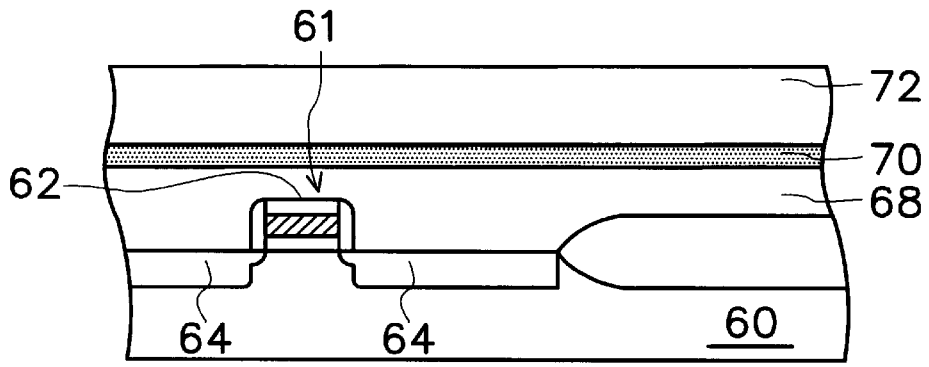
FIGS. 1–7 are cross-sectional views of a memory cell, schematically illustrating a fabrication process of a capacitor in the memory cell, according to a preferred embodiment of the invention.

In FIG. 1, a field effect transistor (FET) 61 is formed on a substrate 60. The FET 61 belongs to one of a memory cell array (not shown). A cylinder capacitor of the invention is to be formed on the FET 61. The FET 61, for example, is a metal-oxide semiconductor (MOS) transistor, which includes a gate structure 62, an interchangeable source/drain region 64 in the substrate 60 at each side of the gate structure 62. A dielectric layer 68, an etching stop layer 70, and an insulating layer 72 are sequentially formed over the substrate 60. The dielectric layer 68 includes, for example, silicon nitride, silicon oxide, phosphosilicate glass (PSG), or borophosphosilicate glass (BPSG) and preferably formed by chemical vapor deposition (CVD), such as plasma enhanced CVD (PECVD). A thermal flow process is preferably performed to further planarize the dielectric layer 68. The etching stop layer 70 including, for example, silicon nitride is formed by, for example, PECVD. The insulating layer 72 including, for example, silicon dioxide is formed by, for example, PECVD.

Figure 2:
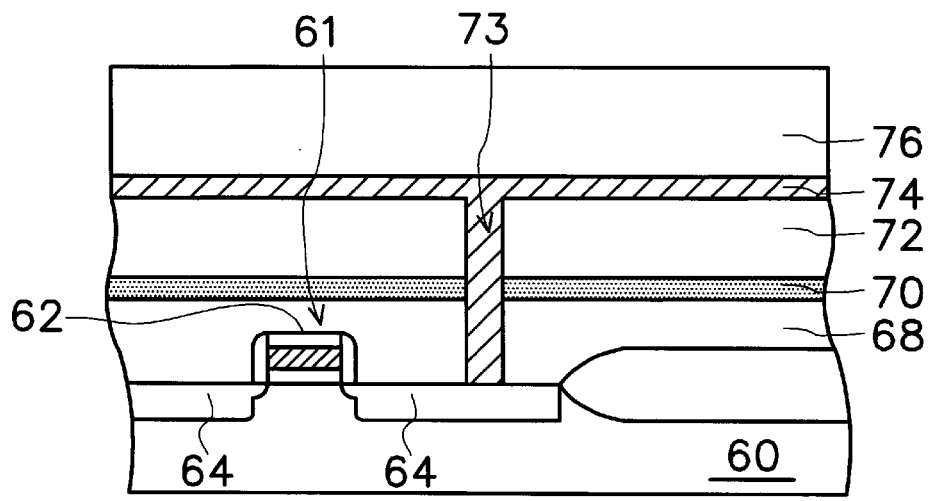

In FIG. 2, an opening 73 is formed by patterning the insulating layer 72, the etching stop layer 70, and the dielectric layer 68 through, for example, photolithography and dry etching. The opening 73 exposes the interchange source/drain region 64 at one side of the gate structure 62. The reaction gas preferably includes $CF_4$ gas. A conductive layer 74 including, for example, amorphous silicon or doped polysilicon is formed over the substrate 60 so that the opening 73 is also filled by the conductive layer 74. The formation process of the conductive layer 74 includes, for example, low pressure CVD (LPCVD). A planarization process including, for example, a chemical mechanical polishing (CMP) process is performed to planarize the conductive layer 74. An insulating layer 76 preferably including silicon dioxide is formed on the conductive layer 74 by, for example, LPCVD. The thickness of the insulating layer 76 is about 1000 Å–3000 Å.

Figure 3:
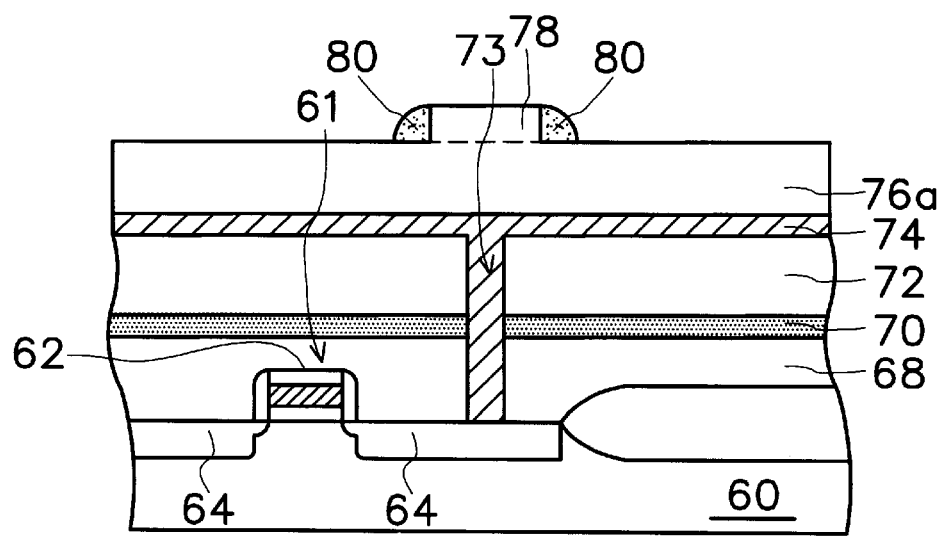

In FIG. 2 and FIG. 3, a top portion of the insulating 76 other than a region above the opening 73 is removed by, for example, photolithography and etching so that the insulating layer 76 becomes an insulating layer 76a with a convex layer 78 on its top above the opening 73. Two spacers 80 including, for example, polysilicon are respectively formed on each sidewall of the convex layer 78.

Figure 4:
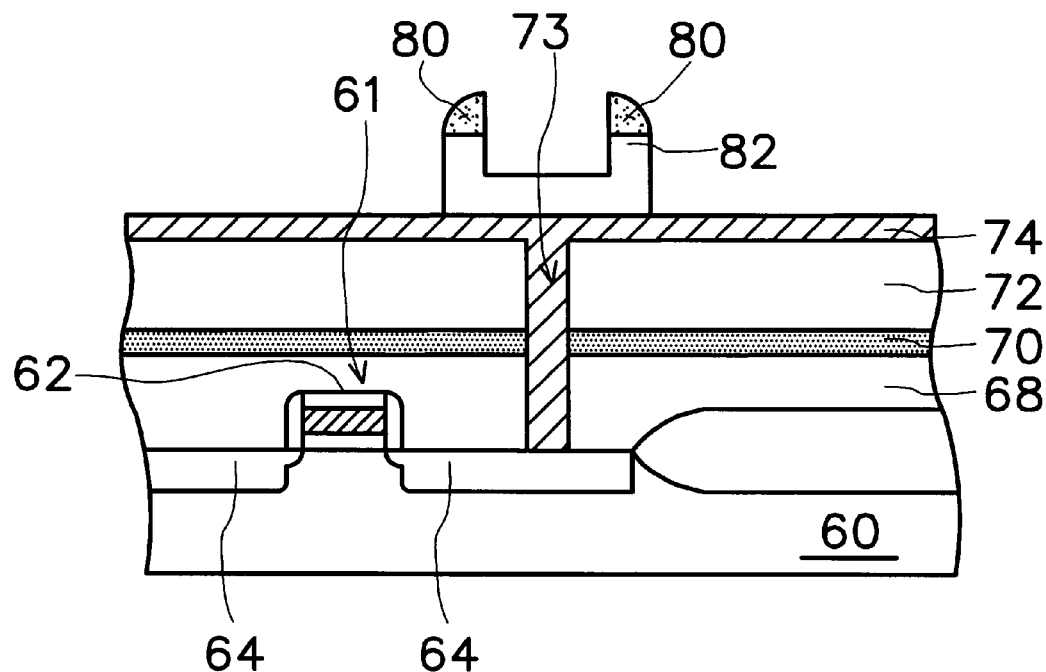

In FIG. 4, using the spacers 80 as an etching mask and the conductive layer 74 as an etching stop point, an etching process, such as a reactive ion etching (RIE) process, is performed to remove the insulating layer 76a so that a portion of the conductive layer 74 is exposed. A remaining portion of the insulating layer 76a forms a concave structure 82 on the conductive layer 74 above the opening 73.

Figure 5:
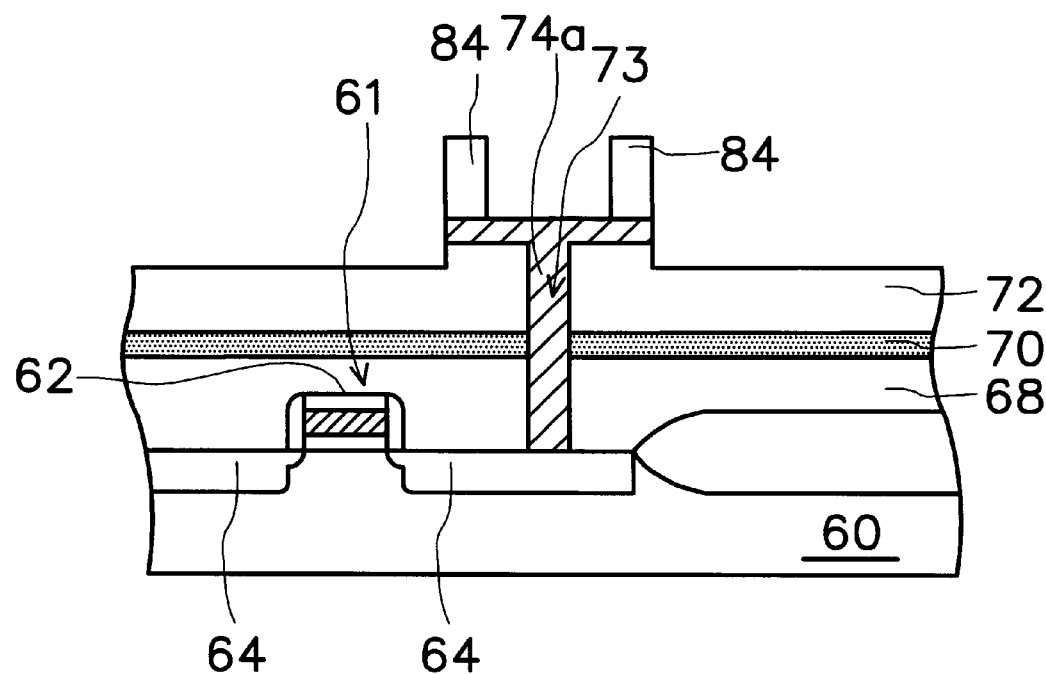

In FIG. 4 and FIG. 5, using the concave structure 82 as a mask, the exposed portion of the conductive layer 74 is removed by etching with an etchant reaction gas, such as a gas mixed by Cl and HBr. The conductive layer 74 becomes a conductive layer 74a under the concave structure 82. A portion of the insulation layer 72 other than the concave structure 82 is exposed. Using the spacers 80 as a mask and the conductive layer 74a as an etching stop point, the exposed portion of the insulation layer 72 and an exposed portion of the concave structure 82 other than the spacers 80 are etched. Thus, the concave structure 82 becomes two pillars 84 under the spacers 80, and a portion of the conductive layer 74a between the pillars 84 is exposed. Since both the concave structure 82 originated from the insulating layer 76 of FIG. 2 and the insulating layer 72 preferably include silicon dioxide, the exposed portion of the insulation layer 72 is also etched. If the insulation layer 72 includes other kind of oxide, it may not be etched more. The etched portion can contribute more charge storage surface for a capacitor to be formed. This can be seen later. The spacers 80 are then removed.

Figure 6:
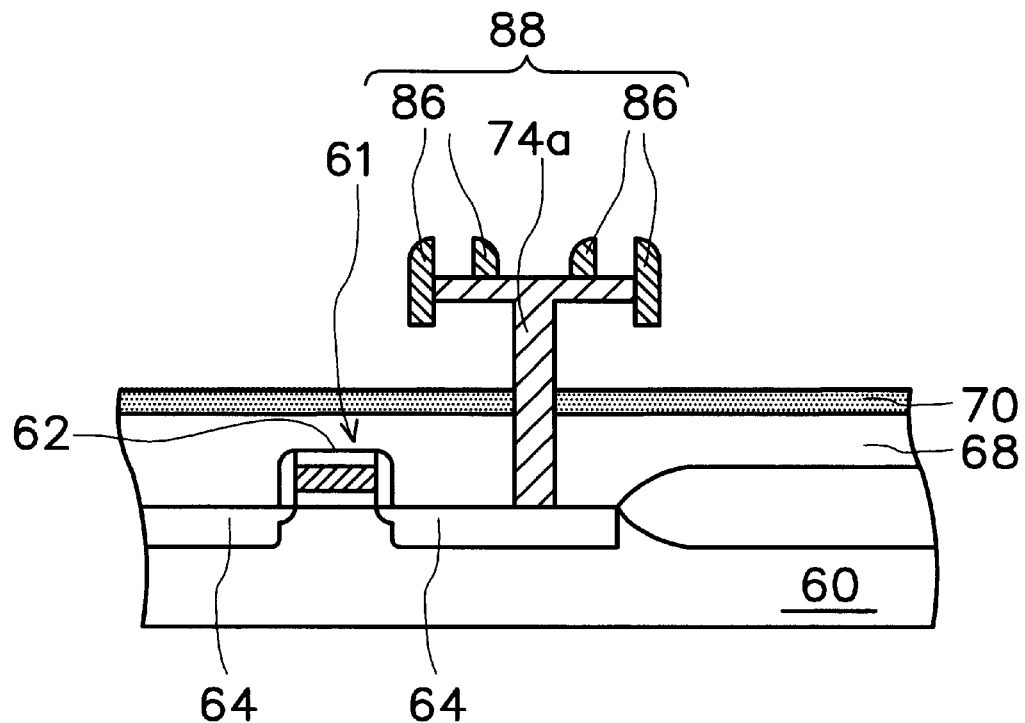

In FIG. 5 and FIG. 6, four conductive spacers 86 are respectively formed on each sidewall of the pillars 84. The outer two conductive spacers 86 are located on the insulating, layer 72, and the inner two conductive spacers 86 are located on the conductive layer 74a. The conductive spacers 86 have electrical contact with the conductive layer 74a. The formation process of the conductive spacers 86 includes, for example, depositing a pre-conductive layer (not shown) over the substrate 60 by, for example, LPCVD, and performing an etching back process to remover the pre-conductive layer. A remaining portion of the pre-conductive layer forms the conductive spacers 86. Using the etching stop layer 70 as an etching stop point, a wet etching process, for example, is performed to remove the pillars 84 and the insulating layer 72 so that the conductive spacers 86 and a portion of the conductive layer 74a are exposed. The conductive spacers 86 and the conductive layer 74a serve together as a lower electrode 88 of a cylinder capacitor, which is electrically coupled to the interchangeable source/drain region 64.

Figure 7:
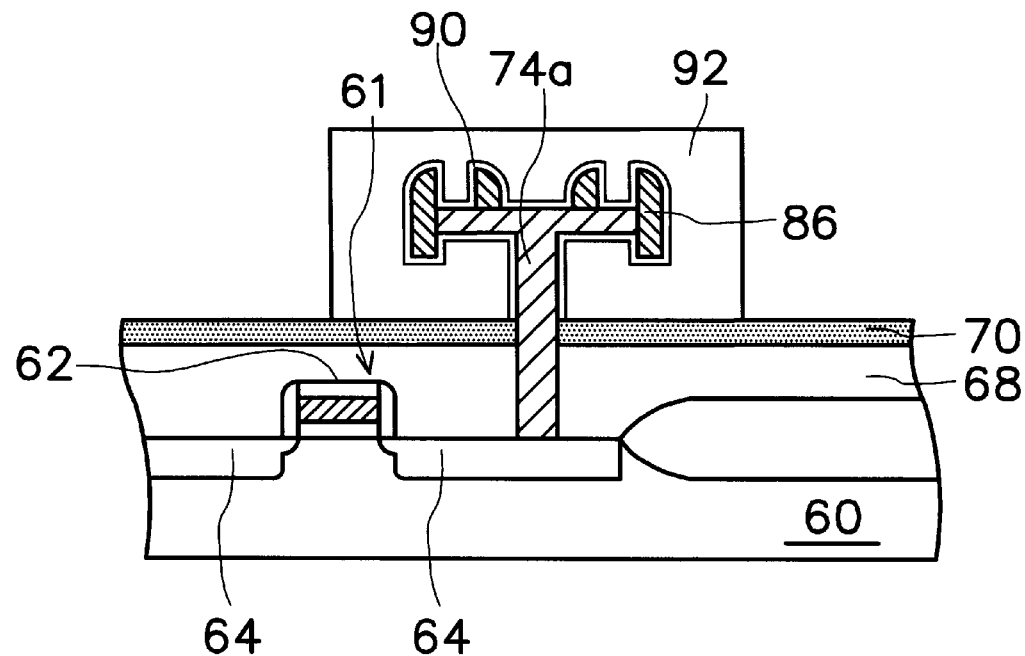

In FIG. 7, a dielectric film layer 90 is formed over the exposed portion of the lower electrode 88 of FIG. 6. The dielectric film layer 90 includes, for example, a silicon-oxide/silicon-nitride/silicon-oxide (O/N/O) structure. A conductive layer 92 is formed over the substrate 60 to enclose the dielectric film layer 90 so as to serve as an upper electrode of the cylinder capacitor. The cylinder capacitor is formed on a memory cell, such as a memory cell of a DRAM device.

In the above descriptions about the method of the invention, the invention has several advantages as follows:

1. Through the formation of the concave structure 82, several conductive spacers 86 can be formed to increase the charge storage surface so that the capacitance can be effectively increased without increasing horizontal dimension of the memory cell.

2. The dimension of the conductive spacers 86 can be controlled by a formation of the pillars 84, which further controlled by the formation of the insulating layer 76 of FIG. 2. The conductive spacers 86 can be formed, for example, in a small thickness, and a large length.

3. The conductive spacers 86 can be easily formed without extra difficulty.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a cylinder capacitor on a field effect transistor (FET), which is formed on a semiconductor substrate, the FET comprising a gate structure, two interchangeable source/drain regions respectively on each side of the gate, the method comprising:

sequentially forming a dielectric layer, an etching stop layer, and a first insulating layer over the substrate;

patterning the dielectric layer, the etching stop layer, and the first insulating layer to form an opening that exposes one of the interchangeable source/drain regions of the FET;

forming a conductive layer over the substrate so that the opening is also filled;

forming a second insulating layer on the conductive layer;

removing a top portion of the second insulating layer, other than the region above the opening, so as to form a convex layer on top;

forming two sidewall spacers respectively on each sidewall of the convex layer;

using the sidewall spacers as a mask, removing a portion of the second insulating layer so that a concave structure is formed on the conductive layer, wherein the concave structure is a remaining portion of the second insulating layer, and the conductive layer is exposed at a portion other than the concave structure;

using the concave structure as a mask, removing the exposed portion of the conductive layer so as to expose a portion of the first insulating layer;

using the sidewall spacers as a mask, removing the concave structure at a portion without being covered by the sidewall spacers so as to expose the conductive layer, and a remaining portion of the concave structure under the sidewall spacers forms two pillars;

forming a plurality of conductive spacers respectively on each sidewall of the pillars, wherein the conductive spacers electrically contact the conductive layer; and removing the pillars and the first insulating layer to expose the conductive spacers and a portion of the conductive layer.

2. The method of claim 1, wherein after the step of removing the pillars and the first insulating layer, the method further comprises:

forming a dielectric film layer over the exposed potion of the conductive spacers and the conductive layer; and forming a conductive electrode over the substrate to cover the dielectric film layer.

3. The method of claim 1, wherein the step of sequentially forming a dielectric layer, an etching stop layer, and a first insulating layer further comprises a thermal flow process is further comprised to planarize the dielectric layer.

4. The method of claim 1, wherein the step of using the sidewall spacers as a mask, removing a portion of the second insulating layer comprises a reactive ion etching (RIE) process.

5. The method of claim 1, wherein the sidewall spacers comprise silicon nitride.

6. The method of claim 1, wherein the second insulating layer comprises a thickness of about 1000 Å–3000 Å.

7. The method of claim 1, wherein the step of forming the conductive layer further comprises a chemical mechanical polishing (CMP) process to planarize the conductive layer.

8. The method of claim 1, wherein the step of removing the pillars and the first insulating layer further comprises a wet etching process.

9. The method of claim 1, wherein the conductive layer comprises amorphous silicon.

10. The method of claim 1, wherein the step of forming the conductive spacers further comprises:

depositing a preliminary conductive layer over the substrate; and performing an etching back process to remove the preliminary conductive layer so that a remaining portion of the preliminary conductive layer forms the conductive spacers on each sidewall of the pillars.

11. The method of claim 1, wherein in the step of using the sidewall spacers as a mask, removing the concave structure at a portion without being covered by the sidewall spacers, a top portion of the first insulating layer not covered by the concave structure is also etched.

* * * * *